United States Patent
Kim et al.

(10) Patent No.: US 9,159,953 B2
(45) Date of Patent: Oct. 13, 2015

(54) ORGANIC LIGHT-EMITTING DISPLAY DEVICE AND MANUFACTURING METHOD THEREOF

(71) Applicant: SAMSUNG DISPLAY CO., LTD., Yongin, Gyeonggi-Do (KR)

(72) Inventors: Young-Min Kim, Yongin (KR); Deok-Chan Yoon, Yongin (KR); Kie-Hyun Nam, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 13/975,243

(22) Filed: Aug. 23, 2013

(65) Prior Publication Data
US 2014/0252325 A1 Sep. 11, 2014

(30) Foreign Application Priority Data
Mar. 5, 2013 (KR) .......... 10-2013-0023571

(51) Int. Cl.
*H01L 51/52* (2006.01)

(52) U.S. Cl.
CPC ........ *H01L 51/5259* (2013.01); *H01L 51/5246* (2013.01)

(58) Field of Classification Search
None
See application file for complete search history.

(56) References Cited

U.S. PATENT DOCUMENTS

| | | |
|---|---|---|
| 7,863,207 B2 | 1/2011 | Son et al. |
| 2007/0001596 A1* | 1/2007 | Murayama et al. ........... 313/506 |
| 2007/0096631 A1* | 5/2007 | Sung et al. .................... 313/498 |
| 2012/0064278 A1* | 3/2012 | Chen .............................. 428/76 |
| 2012/0112212 A1 | 5/2012 | Kim |
| 2012/0169229 A1* | 7/2012 | You et al. ......................... 315/51 |
| 2013/0049580 A1* | 2/2013 | Maindron et al. ............ 313/512 |

FOREIGN PATENT DOCUMENTS

| | | |
|---|---|---|
| KR | 10-2005-0048133 A | 5/2005 |
| KR | 10-2009-0026421 A | 3/2009 |
| KR | 10-2012-0049021 A | 5/2012 |
| WO | WO 02/071506 A1 | 9/2002 |

* cited by examiner

*Primary Examiner* — Charles Garber
*Assistant Examiner* — Alia Sabur
(74) *Attorney, Agent, or Firm* — Christie, Parker & Hale, LLP (57) ABSTRACT

An organic light-emitting display device includes a first substrate; a display unit on the first substrate; an encapsulation layer covering the display unit; a second substrate on the first substrate, wherein the display unit is interposed therebetween; a sealant between the encapsulation layer and the second substrate and at the outside of the display unit, wherein the sealant bonds the encapsulation layer and the second substrate to seal them; and a getter on the encapsulation layer in a region between the sealant and the display unit.

12 Claims, 5 Drawing Sheets

ORGANIC LIGHT-EMITTING DISPLAY DEVICE AND MANUFACTURING METHOD THEREOF

CROSS-REFERENCE TO RELATED PATENT APPLICATION

This application claims priority to and the benefit of Korean Patent Application No. 10-2013-0023571, filed on Mar. 5, 2013, in the Korean Intellectual Property Office, the disclosure of which is incorporated herein in its entirety by reference.

BACKGROUND

1. Field

Embodiments of the present invention relate to an organic light-emitting display device and a method of manufacturing the same.

2. Description of the Related Art

Display devices are devices that display an image, and organic light-emitting display devices have recently drawn attention.

Organic light-emitting display devices emit light themselves and do not require a separate light source, unlike liquid crystal display devices, and thus the thickness and weight thereof may be reduced. In addition, organic light-emitting display devices have high quality characteristics such as low power consumption, high brightness, and high response speed.

In order to increase (or improve) the performance and lifespan of the organic light-emitting display device, the organic light-emitting display device may be tightly sealed to decrease (or minimize) the effect (or influence) of moisture and gas that may permeate (or enter) the organic light emitting display device from the outside. However, there may be a problem in that electrodes and an organic layer included in the above-described general organic light-emitting display device, and in particular, in an organic light-emitting element, are affected by oxygen and moisture that permeate (or enter) into the organic light-emitting display device. Consequently, the electrodes and the organic layer may deteriorate.

SUMMARY

Aspects of embodiments of the present invention are directed toward an organic light-emitting display device that effectively blocks external substances, and a method of manufacturing the organic light-emitting display device.

According to an embodiment of the present invention, there is provided an organic light-emitting display device including: a first substrate; a display unit on the first substrate; an encapsulation layer covering the display unit; a second substrate on the first substrate, wherein the display unit is interposed therebetween; a sealant between the encapsulation layer and the second substrate and at the outside of the display unit, wherein the sealant bonds the encapsulation layer and the second substrate to seal them; and a getter on the encapsulation layer in a region between the sealant and the display unit.

The organic light-emitting display device may further include a filler between the encapsulation layer and the second substrate.

The encapsulation layer may include at least one selected from the group consisting of SiNx, SiOx, SiOC, and SiC and combinations thereof.

The sealant may include a photo-curing material.

The getter may be cured from a liquid phase to a solid phase.

The encapsulation layer may include an inorganic layer.

The second substrate may be an opaque substrate, and the display unit may be configured to emit light toward the first substrate.

According to another aspect of the present invention, there is provided an organic light-emitting display device comprising: a first substrate; a display unit on the first substrate; an encapsulation layer covering the display unit and having a concavo-convex region at the outside of the display unit; a second substrate on the first substrate, wherein the display unit is interposed therebetween; a sealant between the first substrate and the second substrate, wherein the sealant bonds the first substrate and the second substrate together to seal them; and a getter between the sealant and the display unit at the concavo-convex region.

The organic light-emitting display device may further include a filler between the encapsulation layer and the second substrate.

The encapsulation layer may include at least one selected from the group consisting of SiNx, SiOx, SiOC, SiC and combinations thereof.

The sealant may include a photo-curing material.

The getter may be cured from a liquid phase to a solid phase.

The encapsulation layer may include an inorganic layer.

The second substrate may be an opaque substrate, and the display unit may be configured to emit light toward the first substrate.

According to another embodiment of the present invention, there is provided a method of manufacturing an organic light-emitting display device, the method including: forming an encapsulation layer on a first substrate at which a display unit is located, so as to cover the display unit; forming a sealant on the encapsulation layer at the outside of the display unit; forming a liquid getter in a region between the sealant and the display unit; and bonding the encapsulation layer and the second substrate together to seal them, wherein the display unit is interposed therebetween.

The bonding of the encapsulation layer and the second substrate together may include forming a filler on the second substrate.

The bonding of the encapsulation layer and the second substrate together may include: disposing the second substrate on the encapsulation layer with the liquid getter and the filler interposed therebetween; and curing the sealant by irradiating it with light.

The bonding of the encapsulation layer and the second substrate together may further include applying heat to the liquid getter to change its phase from liquid to solid.

The solid getter and the filler may be separated from each other.

In the forming of the encapsulation layer on the first substrate, the encapsulation layer may have a concavo-convex region at the outside of the display unit.

BRIEF DESCRIPTION OF THE DRAWINGS

The above and other features and aspects of the present invention will become more apparent by describing in detail embodiments thereof with reference to the attached drawings in which.

DETAILED DESCRIPTION

Hereinafter, one or more embodiments of the present invention will be described in detail with reference to the accompanying drawings. As used herein, the term "and/or" includes any and all combinations of one or more of the associated listed items.

Figure 1:
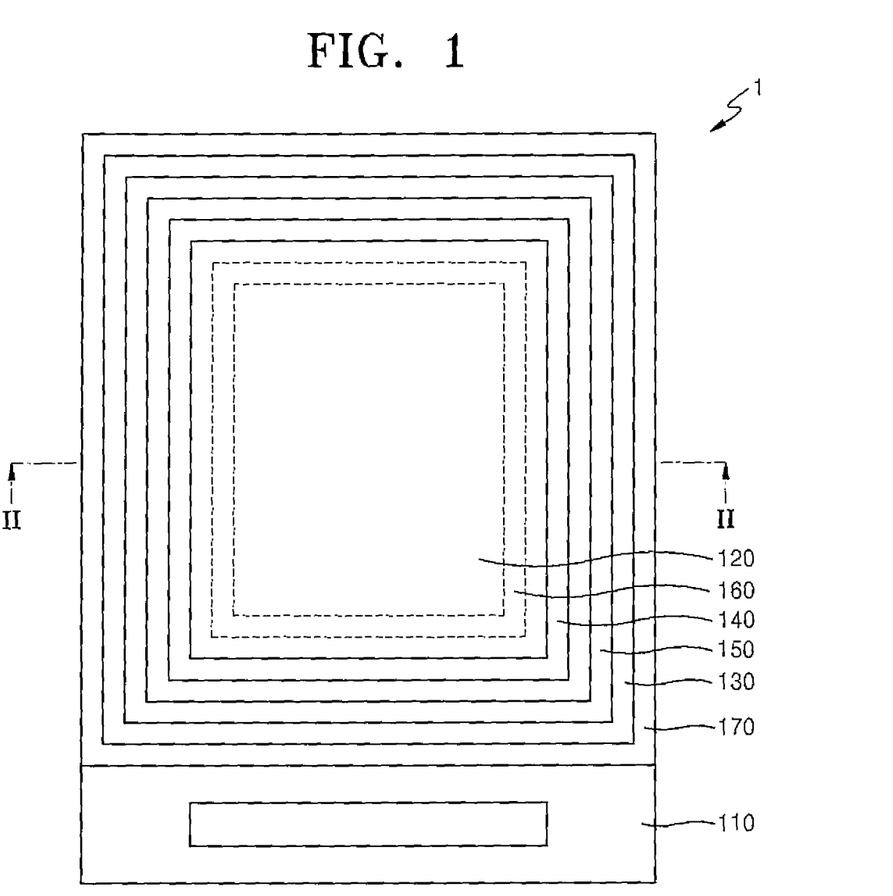
FIG. 1 is a schematic plan view illustrating an organic light-emitting display device according to an embodiment of the present invention.
Figure 2:
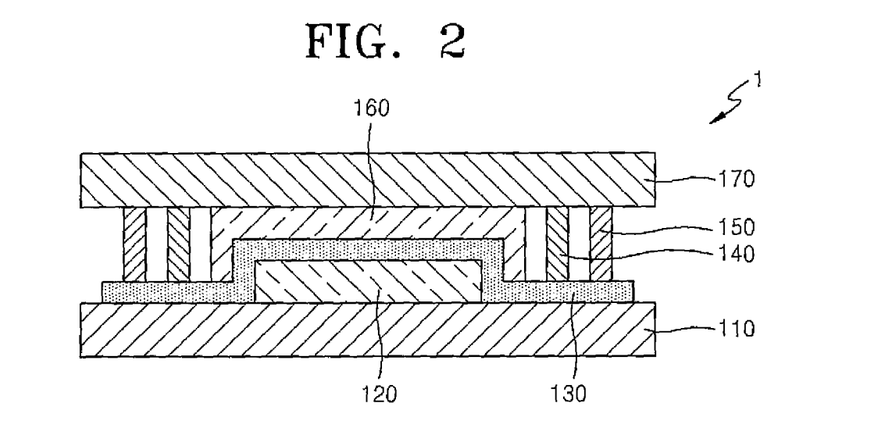
FIG. 2 is a schematic cross-sectional view taken along the line II-II shown in FIG. 1.

FIG. 1 is a schematic plan view illustrating an organic light-emitting display device 1 according to an embodiment of the present invention. FIG. 2 is a schematic cross-sectional view taken along the line II-II shown in FIG. 1.

Referring to FIGS. 1 and 2, the organic light-emitting display device 1 according to the current embodiment of the present invention may include a first substrate 110, a display unit 120, an encapsulation layer 130, a getter 140, a sealant 150, a filler 160, and a second substrate 170.

The first substrate 110 and the second substrate 170 are substrates that may include glass, a polymer, a metal, or the like, and at least one of the first substrate 110 and/or the second substrate 170 may be formed of a light transmitting material. The first substrate 110 may be formed of a light transmitting material, and the second substrate 170 may be formed of a non-light transmitting material. In other words, the second substrate 170 may be an opaque substrate containing aluminum (Al) or copper (Cu). The display unit 120 is located on the first substrate 110, and the second substrate 170 faces the first substrate 110 with the display unit 120 and the encapsulation layer 130 interposed therebetween. The second substrate 170 and the encapsulation layer 130 are bonded to each other using the sealant 150 and are sealed. The first substrate 110 and the second substrate 170 protect the display unit 120 from external interference.

The display unit 120 is formed on the first substrate 110 and displays an image.

The encapsulation layer 130 is formed so as to cover the display unit 120 and serves to protect the display unit 120.

Hereinafter, the display unit 120 and the encapsulation layer 130 of the organic light-emitting display device 1 according to the current embodiment of the present invention will be described in detail with reference to FIG. 3.

Figure 3:
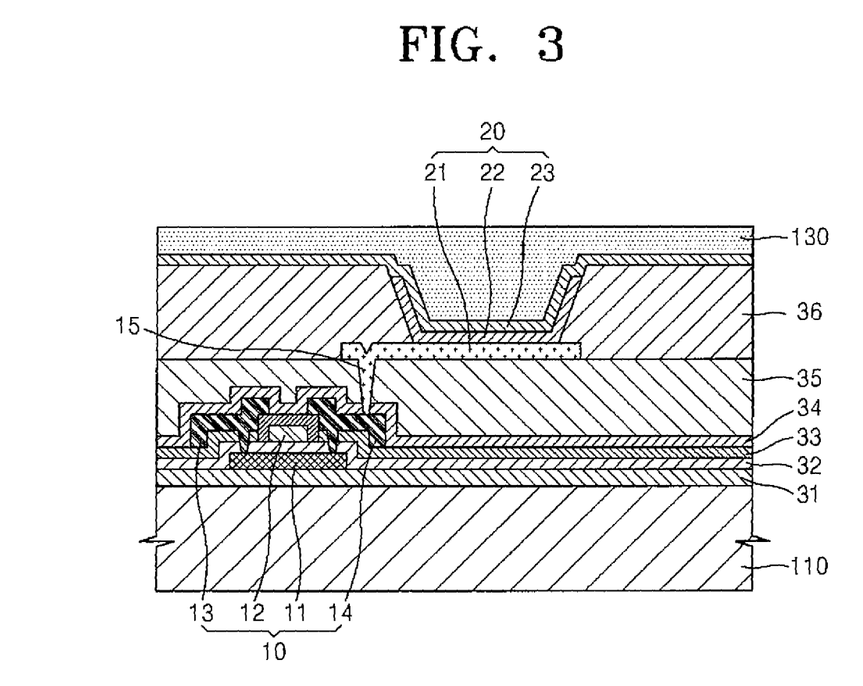
FIG. 3 is a schematic cross-sectional view illustrating a portion of the organic light-emitting display device shown in FIG. 1.

FIG. 3 is a schematic cross-sectional view illustrating a portion of the organic light-emitting display device 1 shown in FIG. 1.

Referring to FIG. 3, the organic light-emitting display device 1 according to the current embodiment includes the first substrate 110, an organic light-emitting element 20, and the encapsulation layer 130. The display unit 120 includes the organic light-emitting element 20.

A thin film transistor (TFT) 10 coupled to the organic light-emitting element 20 and the organic light-emitting element 20 is disposed (or located) on the first substrate 110. Although one organic light-emitting element 20 and one TFT 10 are illustrated in FIG. 3, this is just for convenience of description, and a portion of the light-emitting display device according to the current embodiment may include a plurality of the organic light-emitting elements 20 and a plurality of the TFTs 10.

The organic light-emitting display device may be classified into a passive matrix (PM) organic light-emitting display device and an active matrix (AM) organic light-emitting display device depending on whether the driving of each organic light-emitting element 20 is controlled by the TFT 10. The organic light-emitting display device according to the current embodiment may be applied to either the AM organic light-emitting display device or the PM organic light-emitting display device. Hereinafter, the current embodiment of the present invention will be described in detail by using the AM organic light-emitting display device as an example.

A buffer layer 31 that may be formed of silicon dioxide ($SiO_2$) and/or $SiN_x$ may further be disposed (or located) on the first substrate 110 in order to planarize the first substrate 110 and to reduce (or prevent) the permeation (e.g., the penetration or entrance) of impurities.

An active layer 11 of the TFT 10, which is formed of a semiconductor material according to one embodiment, is formed on the buffer layer 31. The active layer 11 may be formed of polycrystalline silicon, but embodiments of the present invention are not limited thereto, and the active layer 11 may be formed of an oxide semiconductor. For example, the oxide semiconductor may contain any one of Groups 12, 13, and 14 metallic elements including, for example, metal zinc (Zn), indium (In), gallium (Ga), tin (Sn), cadmium (Cd), germanium (Ge), or hafnium (Hf), or an oxide of a material selected from combinations thereof. For example, the active layer 11 may include G-I—Z—O[($In_2O_3$a($Ga_2O_3$b(ZnO)c] (a, b, and c are real numbers satisfying conditions a≥0, b≥0, and c>0, respectively).

A gate insulating layer 32 is formed so as to cover the active layer 11. A gate electrode 12 is disposed (or located) on the gate insulating layer 32, and an insulating interlayer 33 is formed so as to cover the gate electrode 12. A source electrode 13 and a drain electrode 14 are disposed (or located) on the insulating interlayer 33, and a passivation layer 34 and a planarization layer 35 are sequentially disposed (or located) so as to cover the source electrode 13 and the drain electrode 14.

The gate insulating layer 32, the insulating interlayer 33, the passivation layer 34, and the planarization layer 35 may be formed of an insulating material, and may be formed to have a single-layered structure or a multiple-layered structure including an inorganic material, an organic material, or an organic/inorganic composite material. The above-described layered structure of the TFT 10 is just an example, and embodiments of the present invention may be applied to a TFT having any of various other suitable structures.

A first electrode 21 serving as an anode of the organic light-emitting element 20 is formed on the above-mentioned planarization layer 35, and a pixel definition layer 36, which is formed of an insulating material, is formed so as to cover the first electrode 21. After an opening (e.g., a predetermined opening) is formed in the pixel definition layer 36, an organic emission layer 22 of the organic light-emitting element 20 is formed in a region defined by the opening. Then, a second electrode 23 serving as a cathode of the organic light-emitting element 20 is formed so as to cover all pixels. In other embodiments, the polarities of the first electrode 21 and the second electrode 23 may be reversed.

The first electrode 21 may be a transparent electrode or a reflective electrode. When the first electrode 21 is a transparent electrode, the first electrode 21 may be formed of indium tin oxide (ITO), indium zinc oxide (IZO), zinc oxide (ZnO), or indium (III) oxide (In2O3), and when the first electrode 21 is a reflective electrode, the first electrode 21 may have a structure in which a reflective layer formed of ITO, IZO, ZnO, or In2O3 is stacked on a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. Although the second electrode 23 may be a transparent electrode or a reflective electrode, when the second electrode 23 is a transparent electrode, the second electrode 23 may have a structure in which an auxiliary electrode or a bus electrode line formed of a material for forming a transparent electrode, for example, ITO, IZO, ZnO, or In2O3, is stacked on a layer coated with lithium (Li), calcium (Ca), lithium fluoride/calcium (LiF/Ca), lithium fluoride/aluminum (LiF/Al), Al, Mg, or a compound thereof so as to face the organic emission layer 22. When the second electrode 23 is a reflective electrode, the second electrode 23 may be formed by coating Li, Ca, LiF/Ca, LiF/Al, Al, Mg, or a compound thereof, thereon.

The organic emission layer 22 interposed between the first electrode 21 and the second electrode 23 may be formed of a low-molecular weight organic material or a polymer organic material. When the organic emission layer 22 is formed of a low-molecular weight organic material, a hole injection layer (HIL; not shown), a hole transport layer (HTL; not shown), an electron transport layer (ETL; not shown), an electron injection layer (EIL; not shown), and the like may be stacked around the organic emission layer 22 so as to have a single-layered structure or a multiple-layered structure. Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. These low-molecular weight organic materials may be formed by vaccum deposition by using masks.

When the organic emission layer 22 is formed of a polymer organic material, the organic emission layer 22 may have a structure in which an HTL may further be formed toward the anode from the organic emission layer 22. Here, according to one embodiment, Poly(3,4-Ethylene Di Oxy Thiophene) (PEDOT) is used as the HTL, and a polymer organic material (such as a poly-phenylenevinylene (PPV)-based polymer organic material or a polyfluorene-based polymer organic material) is used as an emission layer.

In the above-described embodiment, a case has been described where the organic emission layer 22 is formed within the opening and a separate light-emitting material is formed for each pixel, but embodiments of the present invention are not limited thereto. The organic emission layer 22 may be commonly formed on the entire pixel definition layer 36 regardless of the location of the pixel. For example, the organic emission layer 22 may be formed in such a manner so that layers including light-emitting materials that respectively emit red, green, and blue light are vertically stacked thereon or combined together. As long as the organic emission layer 22 may emit white light, the combination of different colors may be made. In addition, the organic light-emitting display device 1 may further include a color changing layer that changes the emitted white light into a color (e.g., a predetermined color), or a color filter.

Because there is a tendency for the organic light-emitting element 20 to deteriorate due to a material such as moisture or oxygen, the encapsulation layer 130 is disposed (or located), as described above, so as to cover the display unit 120 at which the organic light-emitting element 20 is located.

The encapsulation layer 130 may be formed by alternately stacking at least one organic layer and at least one inorganic layer, or may be formed of only an inorganic layer. Furthermore, a plurality of the inorganic layers and/or a plurality of the organic layers may be formed.

In one embodiment, the organic layer is formed of a polymer, and in one embodiment, is a single layer or a stacked layer which is formed of any one of polyethylene terephthalate, polyimide, polycarbonate, epoxy, polyethylene, and polyacrylate. Moreover, the organic layer may be formed of polyacrylate, and specifically may include a material in which a monomer composition including a diacrylate-based monomer and a triacrylate-based monomer is polymerized. The organic layer may be formed of a material in which a mono acrylate-based monomer is added to the monomer composition. Alternatively, the organic layer may be formed of a material in which a suitable photoinitiator such as TPO is added to the monomer composition, but embodiments of the present invention are not limited thereto.

The inorganic layer may be a single layer or a stacked layer including a metal oxide or a metal nitride. Specifically, the inorganic layer may include at least one selected from the group consisting of $SiN_x$, $Al_2O_3$, $SiO_2$, $TiO_2$, SiOC, SiC, and combinations thereof.

In the encapsulation layer 130, the uppermost layer that is externally exposed may be formed of an inorganic layer in order to reduce (or prevent) moisture from permeating into the organic light-emitting element 20.

Referring back to FIGS. 1 and 2, the sealant 150 is located between the encapsulation layer 130 and the second substrate 170, surrounds the display unit 120 so as to be spaced apart from the display unit 120 at an interval (e.g., a predetermined interval), and is disposed (or located) along edges of the encapsulation layer 130 and the second substrate 170, and thus the encapsulation layer 130 and the second substrate 170 are bonded to each other and sealed. The sealant 150 may include an organic material including epoxy, acryl, silicon, or the like containing a photo-curing material, or an organic/inorganic composite material in which talc, calcium oxide (CaO), barium oxide (BaO), zeolite, SiO or the like is added to an organic material with the sealant 150 having been cured by light such as ultra violet (UV) rays.

A getter 140 is located between the display unit 120 and the sealant 150. The getter 140 may be formed on the encapsulation layer 130. The getter 140 is sealed by the sealant 150, the filler 160, the encapsulation layer 130 at a portion between the sealant 150 and the filler 160, and the second substrate 170 at a portion between the sealant 150 and the filler 160. The getter 140 has a moisture absorbing property, and functions to reduce (or prevent) moisture from permeating (or entering) into the display unit 120 through the sealant 150 from the outside. In other words and according to one embodiment, moisture that may permeate (or enter) into the display unit 120 from the outside is reduced (or blocked) by the getter 140, which increases (or improves) the lifespan of the display unit 120.

In particular and according to one embodiment, the getter 140 has been cured from a liquid phase in the form of paste to a solid phase. In one embodiment, the getter 140 is located on the encapsulation layer 130 in a region between the sealant 150 and the display unit 120.

The filler 160 may be formed between the encapsulation layer 130 and the second substrate 170. In one embodiment, the filler 160 is configured as a liquid or solid filling layer. The filler 160 may include epoxy, silicon, polyimide, or the like.

In one embodiment, the filler 160 is formed so as to be separated from the getter 140. The filler 160 is formed between the encapsulation layer 130 and the second substrate 170, and thus the display unit 120 may be protected from external impact.

In the organic light-emitting display device 1 according to the current embodiment of the present invention, because moisture that may permeate (or enter) into the display unit 120 from the outside is sequentially blocked by the sealant 150 and the getter 140, a reduced (or a minimum) amount of moisture permeates (or enters) into the display unit 120, and thus the lifespan of the display unit 120 is increased (or improved), thereby increasing (or improving) the lifespan of the organic light-emitting display device 1.

In addition, in the organic light-emitting display device 1 according to the current embodiment of the present invention, because the encapsulation layer 130 is formed so as to cover the display unit 120, impurities that may permeate (or enter) into the display unit 120 may be reduced (or blocked) by the encapsulation layer 130. Thus, because the lifespan of the display unit 120 is increased (or improved), the lifespan of the organic light-emitting display device 1 is increased (or improved).

Figure 4:
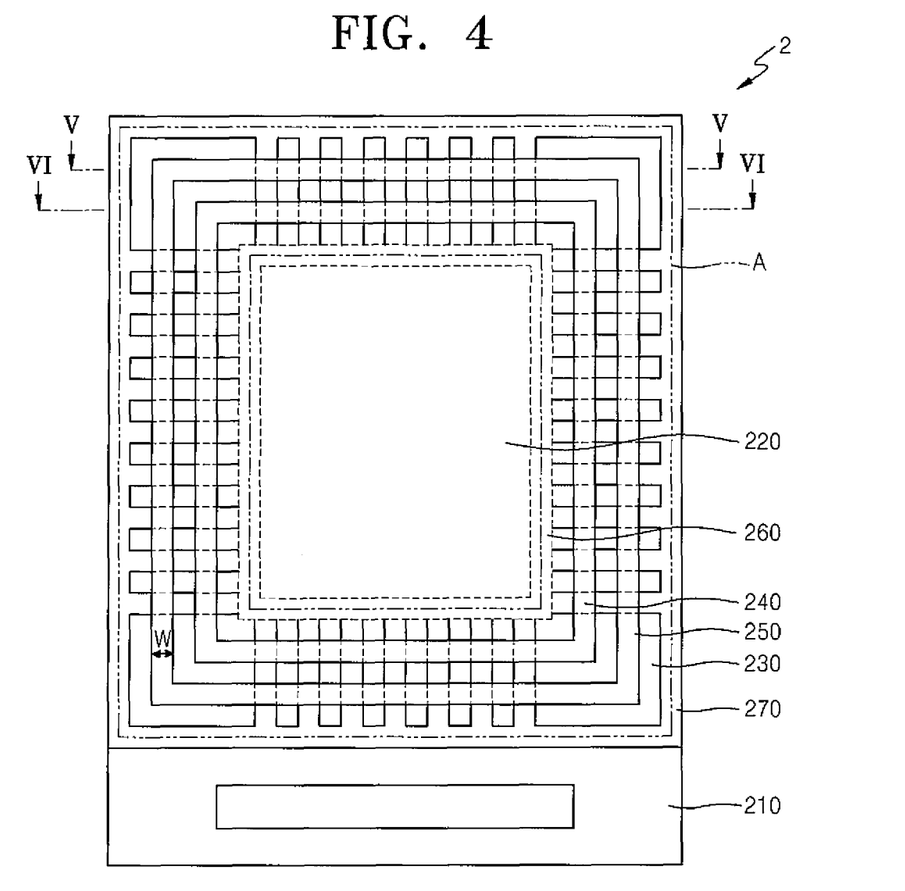
FIG. 4 is a schematic plan view illustrating an organic light-emitting display device according to another embodiment of the present invention.
Figure 5:
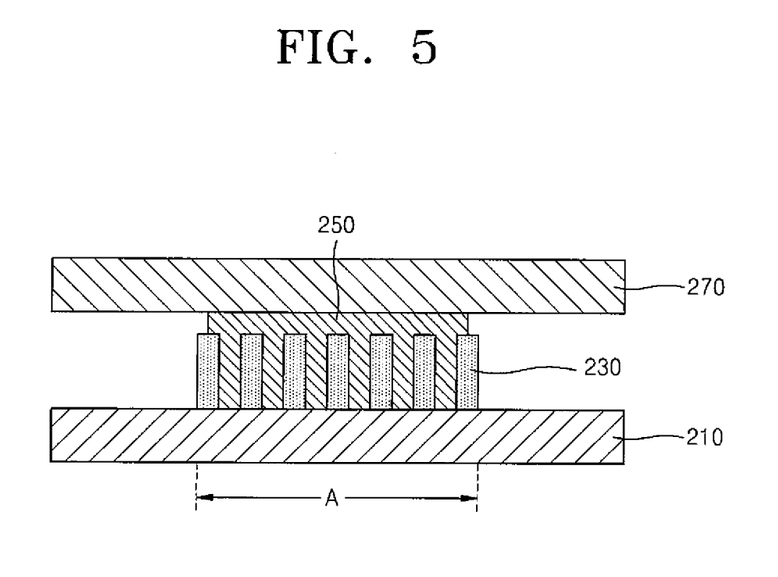
FIG. 5 is a schematic cross-sectional view taken along the line V-V shown in FIG. 4.
Figure 6:
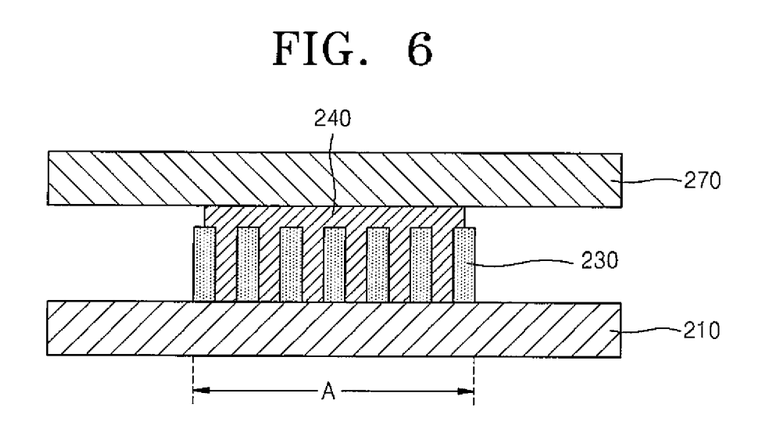
FIG. 6 is a schematic cross-sectional view taken along the line VI-VI shown in FIG. 4.

FIG. 4 is a schematic plan view illustrating an organic light-emitting display device 2 according to another embodiment of the present invention. FIG. 5 is a schematic cross-sectional view taken along the line V-V shown in FIG. 4. FIG. 6 is a schematic cross-sectional view taken along the line VI-VI shown in FIG. 4.

Hereinafter, the current embodiment will be described mainly with regard to differences from the above-described embodiment shown in FIG. 1.

Referring to FIG. 4, the organic light-emitting display device 2 according to another embodiment of the present invention may include a first substrate 210, a display unit 220, an encapsulation layer 230, a getter 240, a sealant 250, a filler 260, and a second substrate 270.

The display unit 220 is located on the first substrate 210, and the second substrate 270 faces the first substrate 210 with the display unit 220 and the encapsulation layer 230 interposed therebetween. The second substrate 270, the encapsulation layer 230, and the first substrate 210 are bonded to each other by the sealant 250 and are sealed. The first substrate 210 and the second substrate 270 protect the display unit 220 from external interference.

The display unit 220 is formed on the first substrate 210 and displays an image.

The encapsulation layer 230 is formed so as to cover the display unit 220 and to protect the display unit 220. In addition, the encapsulation layer 230 has a concavo-convex region A on the outside of the display unit 220.

The concavo-convex region A of the encapsulation layer 230 may be formed using a mask (not shown) having a pattern (e.g., a predetermined pattern) when forming the encapsulation layer 230. When the concavo-convex region A is formed, the getter 240 may contact the encapsulation layer 230 and the first substrate 210, and the sealant 250 may contact the encapsulation layer 230 and the first substrate 210. The shape of the concavo-convex region A is not limited to that illustrated in FIG. 4, and as long as the concavo-convex region A satisfies the above-described conditions, the concavo-convex region A may have any suitable shape.

The sealant 250 is located between the first substrate 210 and the second substrate 270 in the concavo-convex region A of the encapsulation layer 230, surrounds the display unit 220 so as to be spaced apart from the display unit 220 at an interval (e.g., a predetermined interval), and is disposed (or located) along edges of the encapsulation layer 230 and the second substrate 270, and thus the first substrate 210 and the second substrate 270 are bonded to each other and sealed.

The getter 240 is located between the display unit 220 and the sealant 250. The getter 240 may be formed in the concavo-convex region A of the encapsulation layer 230.

Referring to FIG. 5, the sealant 250 is formed in the concavo-convex region A of the encapsulation layer 230, and thus the sealant 250 contacts both the encapsulation layer 230 and the first substrate 210. When the sealant 250 is formed in the concavo-convex region A of the encapsulation layer 230, a contact area between the sealant 250 and the encapsulation layer 230 may be enlarged. Thus, in one embodiment the adhesion between the sealant 250 and the encapsulation layer 230 is increased (or enhanced), thereby increasing (or enhancing) the mechanism reliability of the organic light-emitting display device 2.

In addition, as the contact area between the sealant 250 and the encapsulation layer 230 is enlarged, a width W of the sealant 250 may be reduced while the same contact force as that of a case where the concavo-convex region A is not formed in the encapsulation layer 230 is maintained. Thus, a non-display region of the organic light-emitting display device 2 is reduced, thereby increasing (or improving) the appearance of the organic light-emitting display device 2.

Referring to FIG. 6, the getter 240 is formed in the concavo-convex region A of the encapsulation layer 230, and thus the getter 240 contacts both the encapsulation layer 230 and the first substrate 210. Thus, moisture permeating (or entering) from the outside passes through the encapsulation layer 230 and the getter 240. The encapsulation layer 230 delays the permeation (or entrance) of moisture by reducing (or blocking) a passage (e.g., a permeation passage) of the moisture. The getter 240 formed in the concavo-convex region reduces (or prevents) the penetration of the moisture having been delayed and passed. In other words, the passages (e.g., the permeation passages) of the moisture through the encapsulation layer 230 are dispersed, and thus various moisture permeation blocking lines may be provided.

Figure 7:
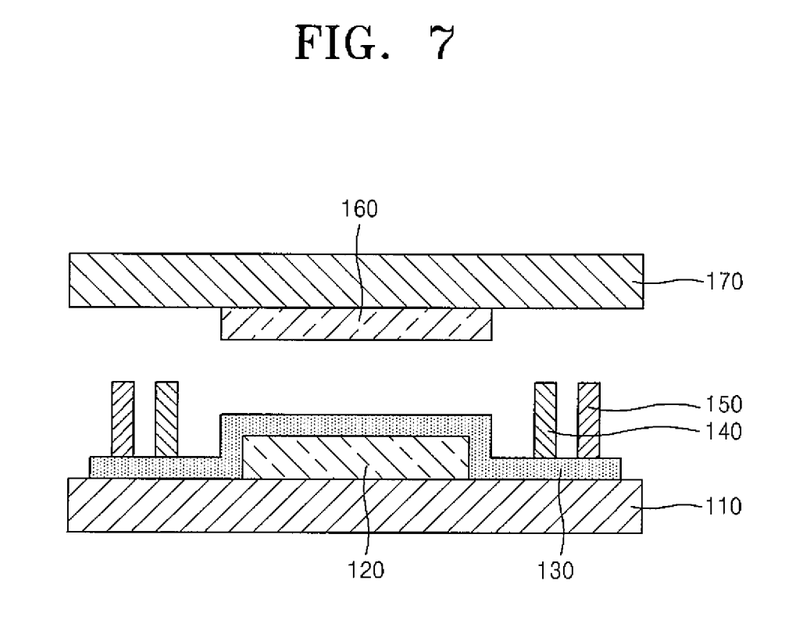
FIGS. 7 and 8 are cross-sectional views illustrating a method of manufacturing the organic light-emitting display device according to the embodiment of the present invention shown in FIG. 1.
Figure 8:
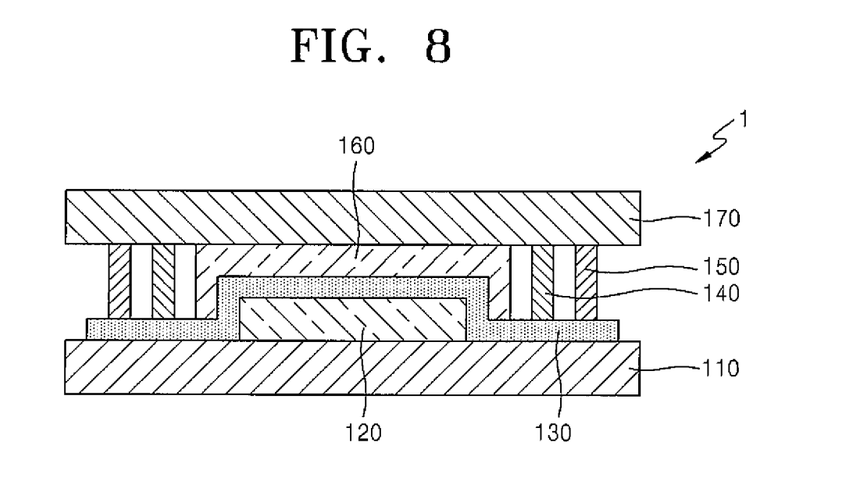

FIGS. 7 and 8 are cross-sectional views illustrating a method of manufacturing the organic light-emitting display device 1 according to the embodiment of the present invention shown in FIG. 1.

Referring to FIGS. 7 and 8, after the display unit 120 and the encapsulation layer 130 are formed on the first substrate 110, the sealant 150 is formed on the encapsulation layer 130 so as to surround the display unit 120 and to be spaced apart from the display unit 120 at an interval (e.g., a predetermined interval). The sealant 150 may be formed of an organic material containing a photo-curing material or an organic/inorganic composite material by using a coating process, a printing process, or the like.

Next, the liquid getter 140 in the form of paste is formed on the encapsulation layer 130 between the sealant 150 and the display unit 120. The liquid getter 140 may be formed by a coating process, a dripping process, a spraying process, or the like.

Next, after the filler 160 is formed on the second substrate 170, the first substrate 110 and the encapsulation layer 130 are bonded (or coupled) to each other and sealed.

Hereinafter, the bonding and sealing of the first substrate 110 and the second substrate 170 will be described in more detail.

First, the second substrate 170 at which the filler 160 is formed is disposed (or located) on the first substrate 110 on which the display unit 120 is located with the liquid getter 140 interposed therebetween. At this time, the second substrate 170 contacts the sealant 150 and the liquid getter 140.

Next, the sealant 150 that is externally exposed is treated with light such as UV rays to cure the sealant 150.

Then, heat is applied to the getter 140 to change its phase from liquid to solid. The solid getter 140 and the solid filler 160 may be separated from each other.

As such, the first substrate 110 (and/or the encapsulation layer 130) and the second substrate 170 are bonded to each other and sealed, thereby completing the manufacture of the organic light-emitting display device 1.

In the above-described process, if the first substrate 110 is formed so as to have a concavo-convex region on the outside of the display unit 120 when forming the display unit 120 and the encapsulation layer 130 on the first substrate 110, the organic light-emitting display device 2 according to another embodiment of the present invention is also manufactured.

According to an aspect of the present invention, external oxygen and moisture that permeates (or enters) into an organic light-emitting element can be effectively reduced (or blocked).

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display device comprising:
    a first substrate;
    a display unit on the first substrate;
    an encapsulation layer covering the display unit and having a concavo-convex region at the outside of the display unit;
    a second substrate on the first substrate, wherein the display unit is interposed therebetween;
    a sealant between the encapsulation layer and the second substrate and at the outside of the display unit, wherein the sealant bonds the encapsulation layer and the second substrate to seal them; and
    a getter between the sealant and the display unit at the concavo-convex region,
    wherein the getter contacts each of the first substrate, the second substrate, and the encapsulation layer.

2. The organic light-emitting display device of claim 1, further comprising a filler between the encapsulation layer and the second substrate.

3. The organic light-emitting display device of claim 1, wherein the encapsulation layer comprises at least one selected from the group consisting of SiNx, SiOx, SiOC, and SiC and combinations thereof.

4. The organic light-emitting display device of claim 1, wherein the sealant comprises a photo-curing material.

5. The organic light-emitting display device of claim 1, wherein the getter is cured from a liquid phase to a solid phase.

6. The organic light-emitting display device of claim 1, wherein the encapsulation layer comprises an inorganic layer.

7. The organic light-emitting display device of claim 1, wherein the second substrate is an opaque substrate, and wherein the display unit is configured to emit light toward the first substrate.

8. A method of manufacturing an organic light-emitting display device, the method comprising:
    forming an encapsulation layer on a first substrate at which a display unit is located, so as to cover the display unit;
    forming a sealant on the encapsulation layer at the outside of the display unit;
    forming a liquid getter in a region between the sealant and the display unit and contacting each of the first substrate, a second substrate, and the encapsulation layer; and
    bonding the encapsulation layer and the second substrate together to seal them, wherein the display unit is interposed therebetween,
    wherein in the forming of the encapsulation layer on the first substrate, the encapsulation layer has a concavo-convex region at the outside of the display unit.

9. The method of claim 8, wherein the bonding of the encapsulation layer and the second substrate together comprises forming a filler on the second substrate.

10. The method of claim 9, wherein the bonding of the encapsulation layer and the second substrate together comprises:
    disposing the second substrate on the encapsulation layer with the liquid getter and the filler interposed therebetween; and
    curing the sealant by irradiating it with light.

11. The method of claim 10, wherein the bonding of the encapsulation layer and the second substrate together further comprises applying heat to the liquid getter to change its phase from liquid to solid.

12. The method of claim 11, wherein the solid getter and the filler are separated from each other.

* * * * *